(12) United States Patent
Nakamura et al.

(10) Patent No.: US 6,480,435 B2
(45) Date of Patent: Nov. 12, 2002

(54) SEMICONDUCTOR MEMORY DEVICE WITH CONTROLLABLE OPERATION TIMING OF SENSE AMPLIFIER

(75) Inventors: Yayoi Nakamura, Hyogo (JP); Takashi Itou, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/931,039

(22) Filed: Aug. 17, 2001

(65) Prior Publication Data

US 2002/0101774 A1 Aug. 1, 2002

(30) Foreign Application Priority Data

Feb. 1, 2001 (JP) ........................................ 2001-025173

(51) Int. Cl.$^7$ ................................................. G11C 7/02
(52) U.S. Cl. .............. 365/207; 365/189.09; 365/230.04
(58) Field of Search ................................ 365/207, 201, 365/203, 189.05, 189.09, 230.04

(56) References Cited

U.S. PATENT DOCUMENTS 5,903,513 A * 5/1999 Itou ....................... 365/189.11
6,259,640 B1 * 7/2001 Endo et al. .................. 365/190

* cited by examiner

*Primary Examiner*—Richard Elms
*Assistant Examiner*—Hien Nguyen
(74) *Attorney, Agent, or Firm*—McDermott, Will & Emery

(57) ABSTRACT

A semiconductor memory device includes control circuits for respectively controlling operation timings of respective sense amplifiers related to an odd-numbered bit line pair and related to an even-numbered bit line pair. The control circuits thus allow respective sense amplifiers provided for bit line pairs adjacent to each other to operate at different timings respectively.

14 Claims, 15 Drawing Sheets

SEMICONDUCTOR MEMORY DEVICE WITH CONTROLLABLE OPERATION TIMING OF SENSE AMPLIFIER

BACKGROUND OF THE INVENTION

1. Field of the Invention

The present invention relates to semiconductor memory devices, and particularly to a semiconductor memory device structured to achieve control of the operation timing of a sense amplifier.

2. Description of the Background Art

A conventional dynamic random access memory is described with regard to a structure of its main portion. It is noted that a signal name having "Z" at the head represents a signal of active L. Referring to FIG. 13, the conventional semiconductor memory device includes a plurality of memory cells 1, a plurality of word lines WL arranged in the row direction, and a plurality of paired bit lines BL<i> and ZBL<i> (i=0, 1, . . . ) arranged in the column direction.

Each bit line pair is connected to a data bus (not shown) via a sense amplifier unit 2. Paired bit lines BL <k> and ZBL <k> are connected to a sense amplifier unit 2 included in a sense amplifier block SB0 located on the left side with respect to the memory region while paired bit lines BL <k+1> and ZBL <k+1> are connected to a sense amplifier unit 2 included in a sense amplifier block SB1 located on the right side with respect to the memory region (k=0, 2, 4, . . . ).

Referring to FIG. 14, sense amplifier unit 2 includes a sense amplifier SA for detecting a potential difference of a corresponding bit line pair, and an equalize-precharge circuit EQ for equalizing and precharging a corresponding bit line pair.

Referring again to FIG. 13, sense amplifier SA included in sense amplifier block SB0 is activated by a sense amplifier activation signal SON <0> and sense amplifier SA included in sense amplifier block SB1 is activated by a sense amplifier activation signal SON <1>.

Equalize-precharge circuit EQ electrically connects, in response to an equalize signal EQ, a line VBL supplying a reference voltage VBL to a corresponding bit line pair at a predetermined timing.

For writing of data into a memory cell as well as reading of data from a memory cell, a bit line pair is precharged to reference potential VBL in advance.

In the reading operation, externally applied address signals ext.A0 to ext.A12 drive a corresponding word line WL into H level. Data in each memory cell 1 connected to that word line WL is read to cause change in the potential on the bit line. Following this, the sense amplifier activation signal goes to H level. Sense amplifier SA differentially amplifies a potential difference between paired bit lines to define data on the bit line pair as "H" or "L".

As shown in FIG. 15, sense amplifier SA includes PMOS transistors T0 to T2, NMOS transistors T3 to T5, and an inverter I0.

Transistor T0 is connected between a node Vcc receiving a supply voltage and a node Z0 and has its gate receiving an output of inverter I0. Transistor T5 is connected between a node Z1 and a node GND receiving a ground voltage and has its gate receiving sense amplifier activation signal SON. Inverter I0 inverts sense amplifier activation signal SON and outputs the inverted signal.

Transistor T1 is connected between nodes Z0 and Z3 and transistor T3 is connected between nodes Z3 and Z1. Transistor T2 is connected between nodes Z0 and Z4 and transistor T4 is connected between nodes Z4 and Z1. Respective gates of transistors T1 and T3 are connected at node Z4 to bit line BL and respective gates of transistors T2 and T4 are connected at node Z3 to bit line ZBL. When sense amplifier activation signal SON goes H, one of the bit lines is driven to the GND level and the other bit line is driven to the Vcc level according to a potential difference of the bit line pair.

Sense amplifier SA and a control circuit have a relation as described below in conjunction with FIG. 16. Referring to FIG. 16, the conventional semiconductor memory device includes an internal circuit 100 receiving an external row address strobe signal ext.ZRAS to output an internal signal ZSONM, a block selection circuit 102 receiving external address signals ext.A0 to ext.A12 to output block selection signals BS<0> to BS<15>, a VBL generating circuit 104 generating reference voltage VBL, a sense amplifier activation signal generating circuit 106 receiving the block selection signals and internal signal ZSONM to output sense amplifier activation signals SON<0> SON<15>, and memory array blocks B0, B1, . . . .

A combination of external address signals ext.A0 to ext.A12 causes activation of block selection signals BS<j> and BS<j+1>for selecting adjacent memory array blocks Bj and Bj+1 among block selection signals BS<0> to BS<15>.

Sense amplifier activation signal generating circuit 106 includes logic circuits 5#0, 5#1, . . . and inverters I1#0, I1#1, . . . arranged respectively corresponding to sense amplifier activation signals SON<0>, SON<1>, Logic circuit 5#i receives at its inputs internal signal ZSONM and block selection signal BS<i>. Inverter I1#i inverts an output of logic circuit 5#1 to output sense amplifier activation signal SON<i>.

When block selection signal BS<i> is "H" and internal signal ZSONM is "L", sense amplifier activation signal SON<i> goes "H". Sense amplifier activation signal SON<I> is supplied to memory array block Bi.

Memory array block Bi includes sense amplifier SA activated by sense amplifier activation signal SON<i>, memory cells holding data to be read by that sense amplifier SA, a plurality of bit line pairs provided corresponding to the memory cells, and equalize-precharge circuit EQ for equalizing and precharging the bit line pairs.

Memory array block Bk includes paired bit lines BL<i> and ZBL<i> as well as sense amplifier block SB0 including sense amplifier unit 2 connected to the paired bit lines BL<i> and ZBL<i> in FIG. 13. Memory array block Bk+1 includes paired bit lines BL<i+1> and ZBL<i+1> as well as sense amplifier block SB1 including sense amplifier unit 2 connected to the paired bit lines BL<i+1> and ZBL<i+1> in FIG. 13 (k=0, 2, 4, . . . , i=0, 2, 4, . . . ).

All memory array blocks Bi are supplied with reference voltage VBL from VBL generating circuit 104.

An operation of the conventional semiconductor memory device is now described. External row address strobe signal ext.ZRAS goes "L". Address signals which are input at this time cause a specific word line WL to be driven into "H". Data of each memory cell connected to the word line WL is output onto bit line ZBL. Internal signal ZSONM goes "L" with a certain delay from the rise timing of word line WL.

It is supposed here that a combination of external input signals ext.A0 to ext.A12 causes block selection signals BS<0> and BS<1>for example to become "H".

Signal ZSONM is "L" and signals BS<0> and BS<1> are "H". Then, sense amplifier activation signals SON<0> and SON<1> go "H". Sense amplifier activation signals SON<0> and SON<1> at "H" activate sense amplifier SA so that data of respective bit lines BL and ZBL are defined as "H" or "L".

The performance of memory cells in such a conventional semiconductor memory device is evaluated through the procedure described below. First, a specific memory cell (object cell) is written with "L" data, memory cells adjacent to the object cell and connected to the same word line WL as that to which the object cell is connected are written with "L" data, and other memory cells connected to that word line WL are all written with "H" data. (This write pattern is herein referred to as a three-sense amplifier pattern.) Then, data of the object cell is read.

It is assumed here that the object cell is connected to paired bit lines BL<3> and ZBL<3>. The object cell and memory cells adjacent to the object cell, namely memory cells connected respectively to paired bit lines BL<3> and ZBL<3>, BL<2> and ZBL<2>, and BL<4> and ZBL<4> are written with "L" data. Memory cells connected to paired bit lines BL<j> and ZBL<j> (j=0, 1, 5, 6, . . . ) are written with "H" data.

Referring to FIG. 17, in a reading operation, "H" data is read from most of the memory cells, so that a faster sense amplifier operation is performed for the memory cells storing "H" data. On the other hand, a sense amplifier operation for the object cell storing "L" data is accordingly delayed.

Floating of ground potential GND which occurs when most of the memory cells are read causes the potential on node GND to float, resulting in a reduced sense margin for reading data of the object cell.

Additionally, bit line ZBL<3> is affected by a coupling noise occurring in reading of data "H" from adjacent bit line BL<2>, and bit line BL<3> is affected by a coupling noise occurring in reading of data "L" from adjacent bit line ZBL<4>. The potential difference between paired bit lines BL<3> and ZBL<3> thus decreases which reduces a read margin.

The three-sense amplifier pattern as discussed above can be employed to reduce a read margin for "L" data in a specific memory cell by influences of the floating of ground potential GND as well as coupling noises from adjacent bit lines and accordingly accelerate a read failure of "L" data. Consequently, products with an enhanced quality can be provided.

However, a test performed following the above-described three-sense amplifier pattern requires that the object cell is changed successively to accomplish data reading and writing for the entire memory cell array. A resultant problem is increase in test time.

SUMMARY OF THE INVENTION

An object of the present invention is to provide a semiconductor memory device structured to achieve a fast test for memory cells.

According to one aspect of the present invention, a semiconductor memory device includes a memory cell array having a plurality of memory cells arranged in a matrix of rows and columns, a plurality of word lines arranged corresponding to respective rows, and a plurality of bit line pairs arranged corresponding to respective columns, and further includes first sense amplifiers for detecting potential differences of a first plurality of even-numbered bit line pairs among the plurality of bit line pairs, second sense amplifiers for detecting potential differences of a second plurality of odd-numbered bit line pairs among the plurality of bit line pairs, and a sense amplifier control circuit for individually controlling respective operation timings of the first and second sense amplifiers.

Preferably, the sense amplifier control circuit includes a first block control circuit generating a first activation signal for controlling activation of the first sense amplifier, and a second block control circuit generating a second activation signal for controlling activation of the second sense amplifier.

In particular, the first block control circuit includes a delay stage and a circuit for outputting in a normal mode an activation signal as the first activation signal and outputting in a test mode the activation signal delayed by the delay stage as the first activation signal.

In particular, the second block control circuit includes a delay stage and a circuit for outputting in a normal mode an activation signal as the second activation signal and outputting in a test mode the activation signal delayed by the delay stage as the second activation signal.

In particular, the first block control circuit generates the first activation signal in synchronization with an external input signal in a test mode.

In particular, the second block control circuit generates the second activation signal in synchronization with an external input signal in a test mode.

In particular, the first block control circuit generates the first activation signal in synchronization with a first external input signal in a test mode, and the second block control circuit generates the second activation signal in synchronization with a second external input signal in the test mode.

According to another aspect of the invention, a semiconductor memory device includes a memory cell array having a plurality of memory cells arranged in a matrix of rows and columns, a plurality of word lines arranged corresponding to respective rows, and a plurality of bit line pairs arranged corresponding to respective columns, and further includes first sense amplifiers for detecting potential differences of a first plurality of even-numbered bit line pairs among the plurality of bit line pairs, second sense amplifiers for detecting potential differences of a second plurality of odd-numbered bit line pairs among the plurality of bit line pairs, a first line supplying voltage for precharging the first plurality of even-numbered bit line pairs, a second line supplying voltage for precharging the second plurality of odd-numbered bit line pairs, and a control circuit for individually controlling respective voltages of the first and second lines.

Preferably, the control circuit includes a first block control circuit controlling the voltage of the first line, and a second block control circuit controlling the voltage of the second line.

In particular, the first block control circuit includes a circuit for determining the voltage of the first line according to a signal received from an external input pin in a test mode.

In particular, the second block control circuit includes a circuit for determining the voltage of the second line according to a signal received from an external input pin in a test mode.

In particular, the first block control circuit includes a circuit for determining in a test mode the voltage of the first line based on a first test mode signal according to a signal received from a first external input pin, and the second block control circuit includes a circuit for determining in the test mode the voltage of the second line based on a second test mode signal according to a signal received from a second external input pin.

In particular, the semiconductor memory device further includes a first generating circuit generating a first reference voltage, and a second generating circuit generating a second reference voltage different from the first reference voltage. The first block control circuit supplies the first reference voltage to the first line in a normal mode, and supplies the second reference voltage to the first line in a test mode. The second block control circuit supplies the first reference voltage to the second line in a normal mode, and supplies the second reference voltage to the second line in a test mode.

The semiconductor memory device according to the present invention can thus individually control respective activation timings of sense amplifiers connected to even-numbered bit line pairs and sense amplifiers connected to odd-numbered bit line pairs. Then, any defective memory cell can speedily be detected without manipulation of data writing pattern.

Further, as the semiconductor memory device according to the invention includes the delay stage in the sense amplifier control circuit, the activation timing can be delayed.

Additionally, the semiconductor memory device according to the invention can activate a sense amplifier in synchronization with an external input.

Further, the semiconductor memory device according to the invention can individually control respective potentials of a line precharging even-numbered bit line pairs and a line precharging odd-numbered bit line pairs. Then, a high-speed detection of any defective memory cell is possible without manipulation of data writing pattern.

Particularly, the semiconductor memory device according to the invention can determine respective potentials of lines by means of external input. In addition, the semiconductor memory device according to the invention includes circuits for generating a plurality of potentials to enable control of the potential of each line.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
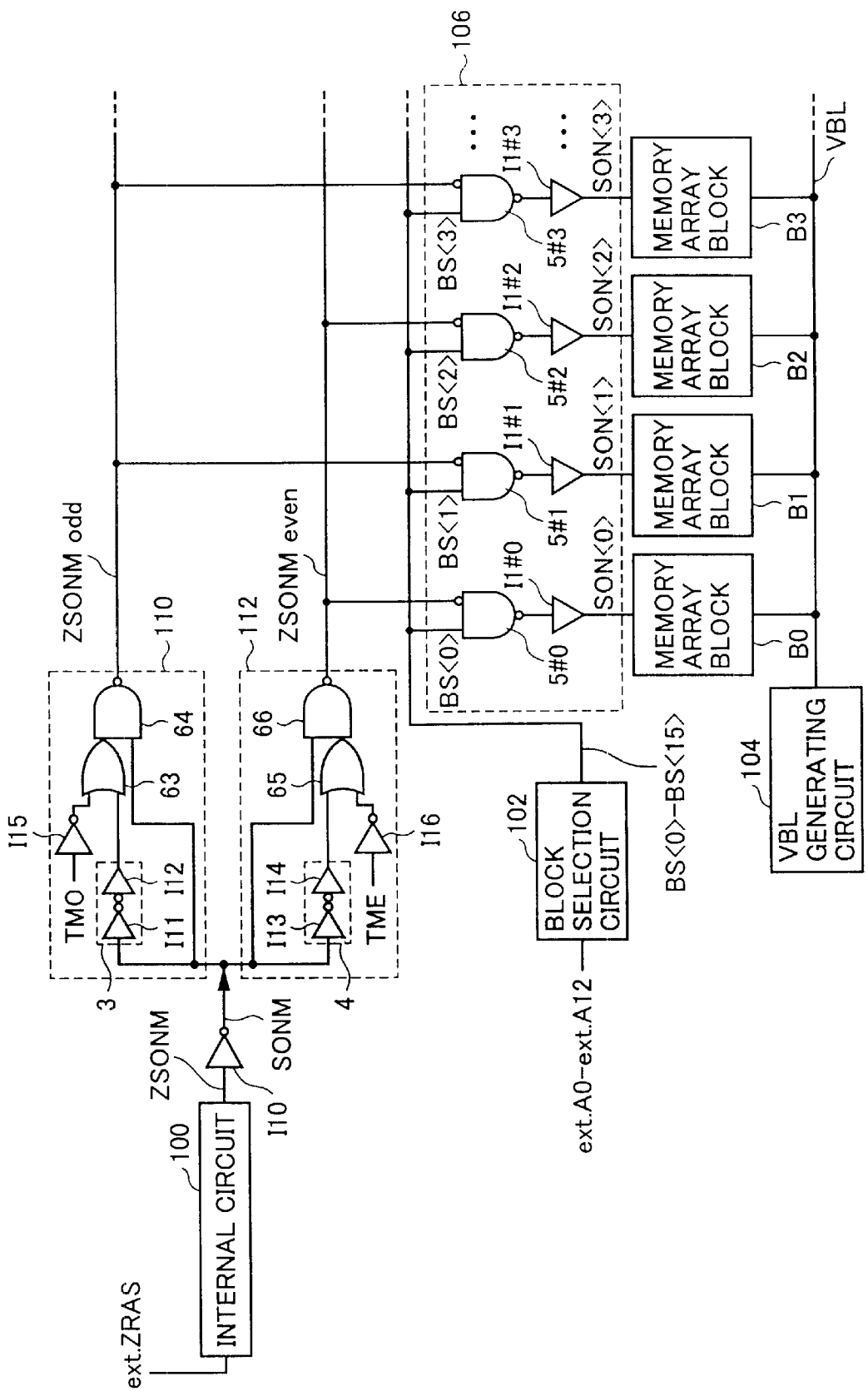
FIG. 1 illustrates a structure of a main portion of a semiconductor memory device according to a first embodiment.

A semiconductor memory device according to embodiments of the present invention is hereinafter described in conjunction with the drawings. The same or corresponding components in the drawings are denoted by the same reference character and description thereof is not repeated here.

First Embodiment

A semiconductor memory device according to a first embodiment has a main portion structured as described below in conjunction with FIG. 1. Referring to FIG. 1, the semiconductor memory device according to the first embodiment includes an internal circuit 100 receiving an external row address strobe signal ext.ZRAS to output an internal signal ZSONM, a block selection circuit 102 receiving external address signals ext.A0 to ext.A12 to output block selection signals BS<0> BS<15>, a VBL generating circuit 104 generating a reference voltage VBL for bit lines, a sense amplifier activation signal generating circuit 106 for generating a sense amplifier activation signal, an inverter I10 inverting internal signal ZSONM to output an internal signal SONM, an odd-number block control circuit 110, an even-number block control circuit 112, and memory array blocks B0, B1 . . . .

Odd-number block control circuit 110 includes a delay stage 3 delaying internal signal SONM, an inverter I15 inverting a test mode signal TMO, an OR circuit 63 and a NAND circuit 64. Delay stage 3 includes inverters I11 and I12 connected in series.

OR circuit 63 receives at its inputs respective outputs of inverter I15 and delay stage 3. NAND circuit 64 has its inputs receiving an output of OR circuit 63 and internal signal SONM to output an internal signal ZSONModd corresponding to a memory array block Bk (k is an odd number, the block referred to as odd block).

Even-number block control circuit 112 includes a delay stage 4 delaying internal signal SONM, an inverter I16 inverting a test mode signal TME, an OR circuit 65 and a NAND circuit 66.

OR circuit 65 receives at its inputs respective outputs of delay stage 4 and inverter I16. NAND circuit 66 receives at its inputs internal signal SONM and an output of OR circuit 65 to output an internal signal ZSONMeven corresponding to a memory array block Bj (j is an even number, the block referred to as even block).

A logic circuit 5#k (k=1, 3, ...) included in sense amplifier activation signal generating circuit 106 receives at its inputs internal signal ZSONModd and a block selection signal BS<k>. A logic circuit 5#j (j=0, 2, ...) has its inputs receiving internal signal ZSONMeven and a block selection signal BS<j>. An inverter I1#h (h=0, 1, 2, ...) inverts an output of a logic circuit 5#h to output a sense amplifier activation signal SON<h>.

Figure 2:
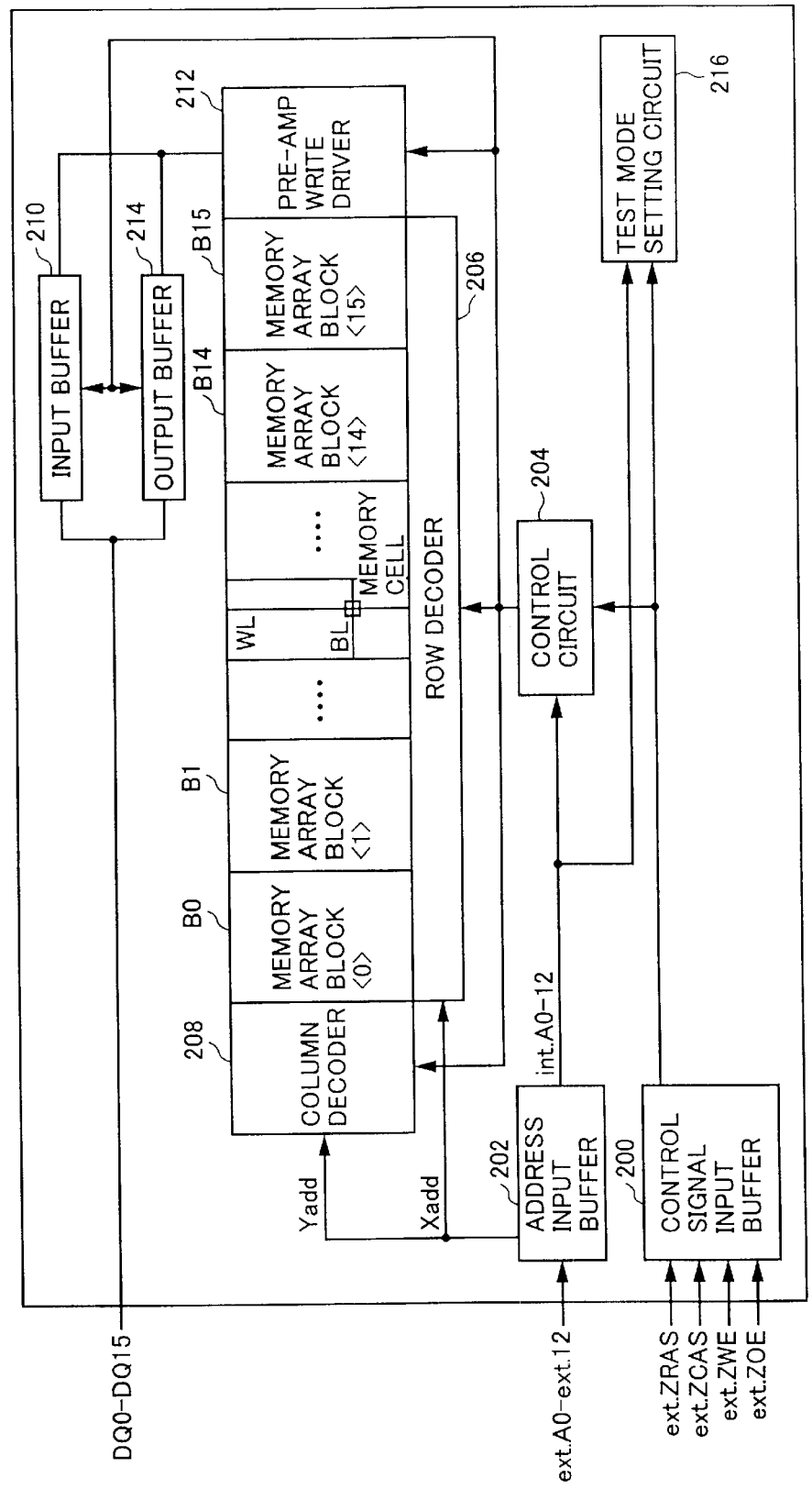
FIG. 2 schematically shows an entire structure of a semiconductor memory device 1000 according to the first embodiment.

Referring to FIG. 2, description is provided of one example of an entire structure of the semiconductor memory device according to the first embodiment. Semiconductor memory device 1000 according to the first embodiment includes as shown in FIG. 2 a control signal input buffer 200 receiving external control signals (external row address strobe signal ext.ZRAS, external column address strobe signal ext.ZCAS, external write enable signal ext.ZWE, external output enable signal ext.ZOE and the like), an address input buffer 202 receiving external address signals ext.A0 to ext.A12, a control circuit 204 receiving internal address signals int.A0 to int.A12 from address input buffer 202 as well as an internal signal from control signal input buffer 200 to output an internal control signal, and a test mode setting circuit 216 receiving internal address signals int.A0 to int.A12 and an internal signal from control signal input buffer 200 to output a test mode signal.

Figure 3:
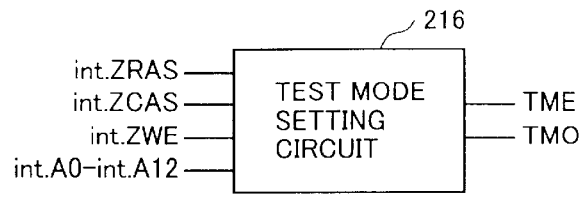
FIG. 3 illustrates a test mode setting circuit 216 according to the first embodiment.

Test mode setting circuit 216 internally generates a test mode signal required for a test mode. According to the first embodiment, as shown in FIG. 3, respective logic levels of test mode signals TM0 and TME are determined according to internal row address strobe signal int.ZRAS, internal column address strobe signal int.ZCAS, internal write enable signal int.ZWE (corresponding respectively to external row address strobe signal ext.ZRAS, external column address strobe signal ext.ZCAS, external write enable signal ext.ZWE) and internal address signals int.A0 to int.A12.

For example, when external column address strobe signal ext.ZCAS and external write enable signal ext.ZWE go "L" before external row address strobe signal ext.ZRAS goes "L" (so-called WCBR mode), a combination of external address signals ext.A0 to ext.A12 is used to determine logic states of test mode signals TM0 and TME.

Referring back to FIG. 2, semiconductor memory device 1000 further includes a row decoder 206, a column decoder 208, an input buffer 210, a preamplifier write driver 212 and an output buffer 214.

Row decoder 206 is controlled by control circuit 204 to select a row designated by a row address Xadd supplied from address input buffer 202. Column decoder 208 is controlled by control circuit 204 to select a column designated by a column address Yadd supplied from address input buffer 202.

Input buffer 210 is controlled by control circuit 204 to receive write data from data input/output pins DQ0 to DQ15. The data in input buffer 210 is written into a corresponding memory cell via preamplifier write driver 212 under control by control circuit 204.

Output buffer 214 is controlled by control circuit 204 to output data read from a memory cell to data input/output pins DQ0 to DQ15.

Figure 4:
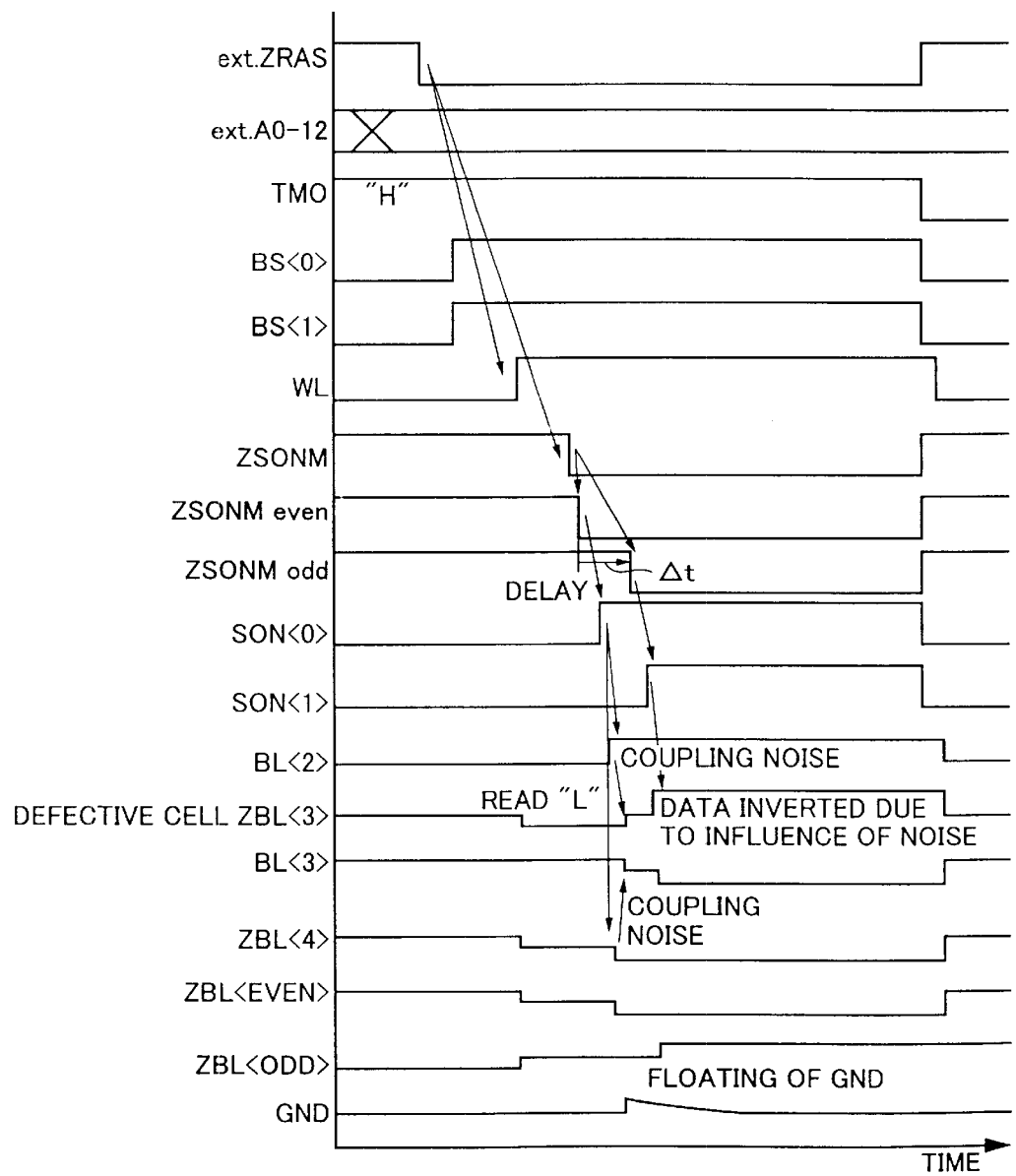
FIG. 4 is a timing chart illustrating an operation of the semiconductor memory device 1000 according to the first embodiment.

Referring to FIG. 4, an operation of semiconductor memory device 1000 according to the first embodiment is described. It is supposed here that any defective memory cell connected to paired bit lines BL<3> and ZBL<3> included in memory array block B1 is to be detected.

In the defect detection, "L" data is written into memory cells of memory array blocks B0 and B1.

Then, a reading operation is performed. WCBR mode is set. External row address strobe signal ext.ZRAS goes to L level. A combination of external address signals ext.A0 to ext.A12 is used to set test mode signal TM0 at "H" and test mode signal TME at "L". Block selection signals BS<0> and BS<1> are set at "H".

In response to fall of external row address strobe signal ext.ZRAS, a word line is selected.

Internal signal ZSONM goes to "L" level in response to external row address strobe signal ext.ZRAS falling to "L".

As test mode signal TME is at "L", internal signal ZSONMeven corresponding to even blocks goes "L". Sense amplifier activation signal SON<0> goes "H" to activate sense amplifiers SA in memory array block B0 (even block). Accordingly, the potential of a corresponding bit line pair is defined.

As test mode signal TM0 is at "H", internal signal ZSONModd corresponding to odd blocks goes "L" delayed by delay stage 3 by delay time Δt after internal signal ZSONM goes "L". Therefore, sense amplifier activation signal SON<1> goes "H" delayed by delay time Δt relative to sense amplifier activation signal SON<0>.

In this way, sense amplifier SA included in an odd block (sense amplifier block SB1 for example) is activated with a delay relative to sense amplifier SA included in an even block (sense amplifier block SB0 for example).

Accordingly, floating of a ground potential occurring in reading of memory cells of an even block causes decrease in a sense margin for sense amplifier SA of an odd block.

Further, bit line ZBL<3> is affected by a coupling noise occurring in reading of "H" data written in adjacent bit line BL<2> and bit line BL<3> is affected by a coupling noise occurring in reading of "L" data written in adjacent bit line ZBL<4>. Paired bit lines BL<3> and ZBL<3> thus have a decreased potential difference which reduces a read margin.

The semiconductor memory device according to the first embodiment thus accomplishes detection of a defective cell without writing data into memory cells in the three-sense amplifier pattern. As a result, the test time for detecting a defective memory can be shortened.

Second Embodiment

Figure 5:
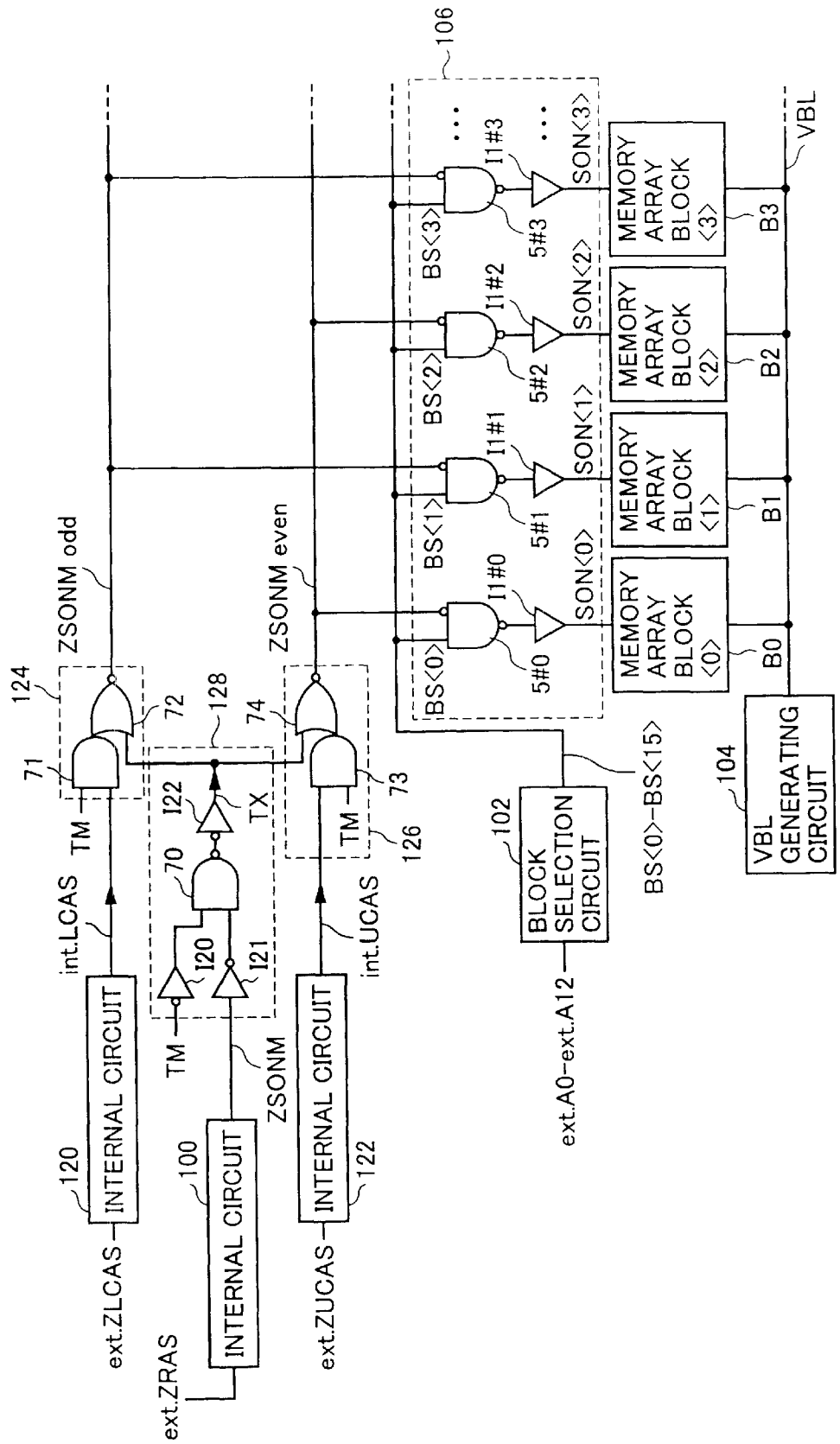
FIG. 5 illustrates a structure of a main portion of a semiconductor memory device according to a second embodiment.

A semiconductor memory device according to a second embodiment has its main portion structured as described below in conjunction with FIG. 5. Referring to FIG. 5, the semiconductor memory device according to the second embodiment includes an internal circuit 100, a block selection circuit 102, a VBL generating circuit 104, an internal circuit 120 receiving a first external column address strobe signal ext.ZLCAS to output an internal signal int.LCAS, an internal circuit 122 receiving a second external column address strobe signal ext.ZUCAS to output an internal signal int.UCAS, a control circuit 128, an odd-number block control circuit 124, an even-number block control circuit 126, and memory array blocks B0, B1 ... Control circuit 128 outputs a signal TX according to an internal signal ZSONM and a test mode signal TM. Control circuit 128 includes inverters I20 to I22 and a NAND circuit 70. Inverter I20 inverts test mode signal TM and inverter I21 inverts internal signal ZSONM. NAND circuit 70 receives respective outputs of inverters I20 and I21 to output a signal /TX. Inverter 122 inverts signal /TX to output signal TX, which is applied to odd-number block control circuit 124 and to even-number block control circuit 126.

Odd-number block control circuit 124 includes an AND circuit 71 and a NOR circuit 72. AND circuit 71 receives at its inputs test mode signal TM and internal signal int.LCAS. NOR circuit 72 receives an output of AND circuit 71 and signal TX to output an internal signal ZSONModd corresponding to odd blocks.

Even-number block control circuit 126 includes an AND circuit 73 and a NOR circuit 74. AND circuit 73 receives at its inputs internal signal int.UCAS and test mode signal TM. NOR circuit 74 receives at its inputs an output of AND circuit 73 and signal TX to output an internal signal ZSONMeven corresponding to even blocks.

A logic circuit 5#k (k=1, 3, . . . ) included in a sense amplifier activation signal generating circuit 106 receives at its inputs internal signal ZSONModd and a block selection signal BS<k>. A logic circuit 5#j (j=0, 2, . . . ) included in sense amplifier activation signal generating circuit 106 receives at its inputs internal signal ZSONMeven and a block selection signal BS<j>. An inverter I1#h (h=0, 1, 2, . . . ) inverts an output of a logic circuit 5#h to output a sense amplifier activation signal SON<h>.

External input is switched to activate one of sense amplifier activation signals SON<h> and <h+1> and inactivate the other thereof.

Figure 6:
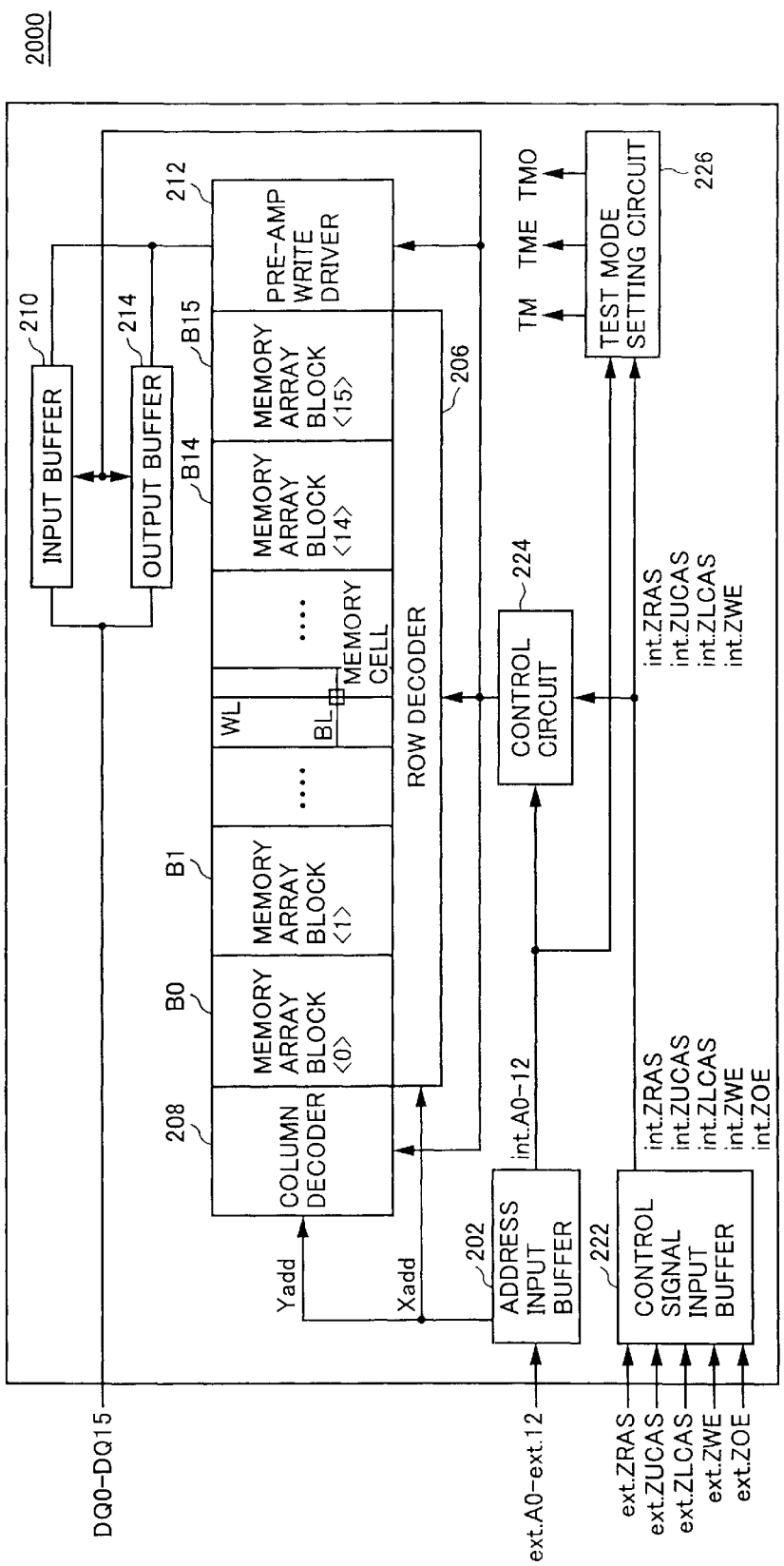
FIG. 6 schematically shows an entire structure of a semiconductor memory device 2000 according to the second embodiment.

One example of an entire structure of the semiconductor memory device according to the second embodiment is described in conjunction with FIG. 6. Referring to FIG. 6, semiconductor memory device 2000 according to the second embodiment includes a control signal input buffer 222 receiving external control signals (external row address strobe signal ext.ZRAS, external column address strobe signals ext.ZLCAS and ext.ZUCAS, external write enable signal ext.ZWE, external output enable signal ext.ZOE and the like), an address input buffer 202, a control circuit 224 receiving internal address signals int.A0 to int.A12 from address input buffer 202 and internal signals from control signal input buffer 222 to output an internal control signal, and a test mode setting circuit 226 receiving internal address signals int.A0 to int.A12 and internal signals from control signal input buffer 222 to output a test mode signal.

Test mode setting circuit 226 determines respective logic levels of test mode signals TMO, TME and TM according to internal row address strobe signal int.ZRAS, internal column address strobe signals int.ZUCAS and int.ZLCAS, internal write enable signal int.ZWE (corresponding respectively to external row address strobe signal ext.ZRAS, external column address strobe signals ext.ZUCAS and ext.ZLCAS, external write enable signal ext.ZWE) and internal address signals int.A0 to int.A12.

The sense amplifier activation signal is activated in synchronization with external input signals (external column address strobe signals ext.ZUCAS and ext.ZLCAS in the example shown).

Figure 7:
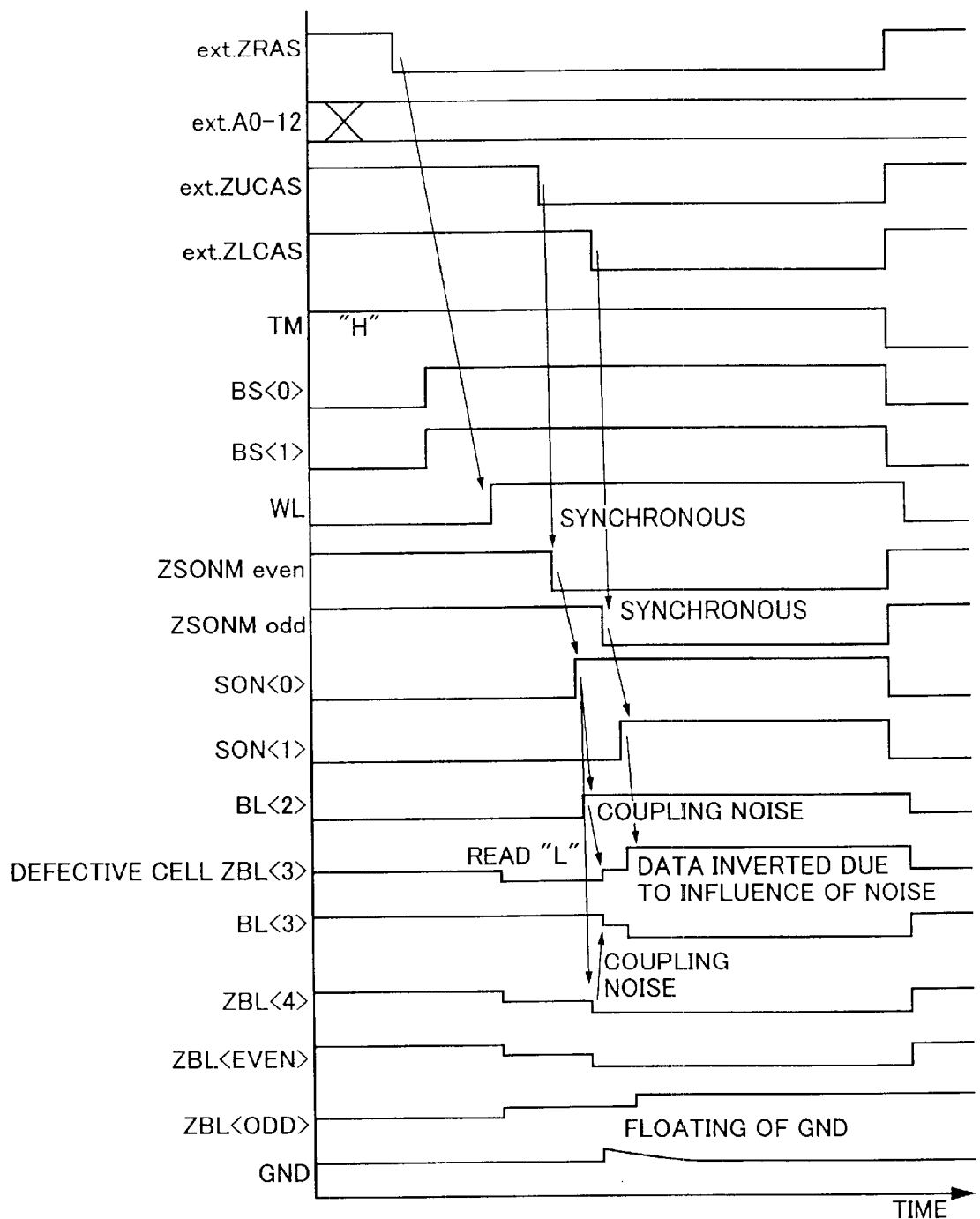
FIG. 7 is a timing chart illustrating an operation of the semiconductor memory device 2000 according to the second embodiment.

Referring to FIG. 7, an operation of the semiconductor memory device according to the second embodiment is described. It is supposed here that any defective memory cell connected to paired bit lines BL<3> and ZBL<3> included in memory array block B1 is to be detected.

In the defect detection, memory cells of memory array blocks B0 and B1 are written with "L" data.

Then, a reading operation is performed. As the first embodiment, WCBR mode is set. Signals ext.A0 to ext.A12 are used to set test mode signal TM at "H". Output /TX of NAND circuit 70 is fixed at "H" regardless of external row address strobe signal ext.ZRAS.

In synchronization with fall of external column address strobe signal ext.ZUCAS, internal signal ZSONMeven falls.

Sense amplifier activation signal SON<0> goes to H level and a sense amplifier SA in an even block is activated. The potential on bit line BL<2> rises while the potential on bit line ZBL<4> falls.

Following this, in synchronization with fall of external signal ext.ZLCAS, internal signal ZSONModd falls.

Sense amplifier activation signal SON<1> goes to H level and a sense amplifier in an odd block is activated.

Because of an influence of floating of the ground potential that occurs in reading of a memory cell of the even block, sense amplifier SA of the odd block has a decreased sense margin.

Further, bit line ZBL<3> is affected by a coupling noise occurring in reading of "H" data written in adjacent bit line BL<2> and bit line BL<3> is affected by a coupling noise occurring in reading of "L" data written in adjacent bit line ZBL<4>. Paired bit lines BL<3> and ZBL<3> thus have a decreased potential difference which reduces a read margin.

The semiconductor memory device according to the second embodiment can control internal signals ZSONModd and ZSONMeven by external column address strobe signals ext.ZUCAS and ext.ZLCAS regardless of rise timing of external row address strobe signal ext.ZRAS.

In this way, external input signals can be activated at different timings to activate, at respective timings different from each other, sense amplifiers SA in an even block and sense amplifiers SA in an odd block, so that the second embodiment achieves similar effects to those of the first embodiment.

Third Embodiment

Figure 8:
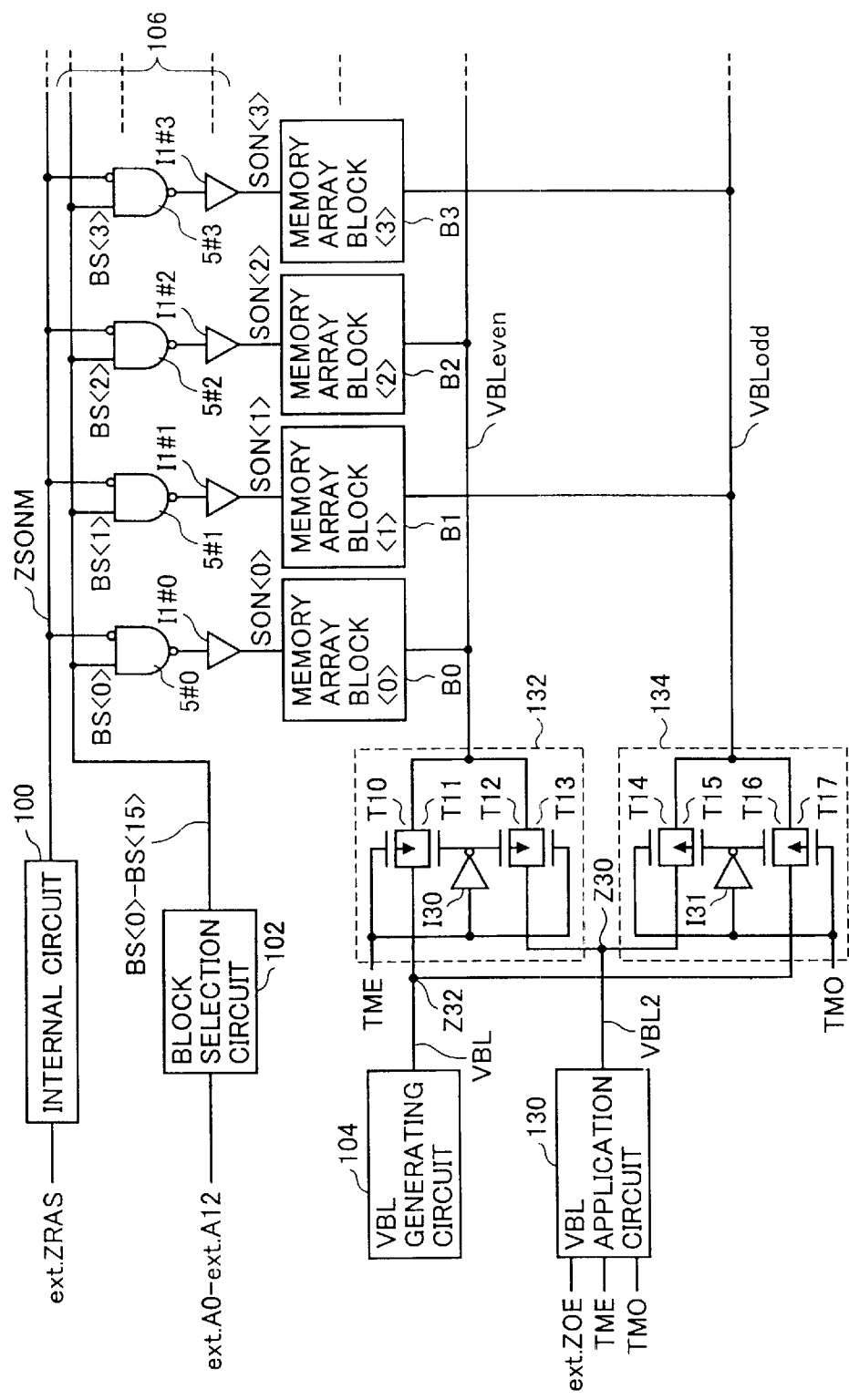
FIG. 8 illustrates a structure of a main portion of a semiconductor memory device according to a third embodiment.

A semiconductor memory device according to a third embodiment has its main portion with a structure as described below in conjunction with FIG. 8. Referring to FIG. 8, the semiconductor memory device according to the third embodiment includes an internal circuit 100, a block selection circuit 102, a VBL generating circuit 104, a VBL application circuit 130, a VBL control circuit 132 related to even blocks, a VBL control circuit 134 related to odd blocks, a sense amplifier activation signal generating circuit 106, and memory array blocks B0, B1, . . . .

A logic circuit 5#i included in sense amplifier activation signal generating circuit 106 receives at its inputs an internal signal ZSONM and a block selection signal BS<i>, and an inverter I1#i inverts an output of logic circuit 5#i to output a sense amplifier activation signal SON<i>.

VBL application circuit 130 supplies a reference potential VBL2 to a node Z30 according to an external output enable signal ext.ZOE and test mode signals TME and TMO. Specifically, VBL application circuit 130 is activated when test mode signal TMO or TME goes "H" to electrically couple a terminal receiving external output enable signal ext.ZOE with node Z30. VBL generating circuit 104 supplies a reference potential VBL to a node Z32.

VBL control circuit 132 includes an inverter I30 and transistors T10 to T13. Transistors T10 and T12 are PMOS transistors while transistors T11 and T13 are NMOS transistors.

Inverter I30 inverts test mode signal TME to output the inverted signal. Transistors T10 and T1 electrically couple node Z32 with a line VBLeven according to test mode signal TME (and the output from inverter I30). Transistors T12 and T13 electrically couple node Z30 with line VBLeven according to test mode signal TME (and the output from inverter I30).

VBL control circuit 134 includes an inverter I31 and transistors T14 to T17. Transistors T15 and T17 are PMOS transistors while transistors T14 and T16 are NMOS transistors.

Inverter I31 inverts test mode signal TMO to output the inverted signal. Transistors T16 and T17 electrically couple node Z32 with a line VBLodd according to test mode signal TMO (and the output from inverter I31). Transistors T14 and T15 electrically couple node Z30 with line VBLodd according to test mode signal TMO (and the output from inverter I31).

A memory array block Bk (k is an even number and at least 0) is supplied with a reference potential from line VBLeven and a memory array block Bk+1 is supplied with a reference potential from line VBLodd.

Figure 9:
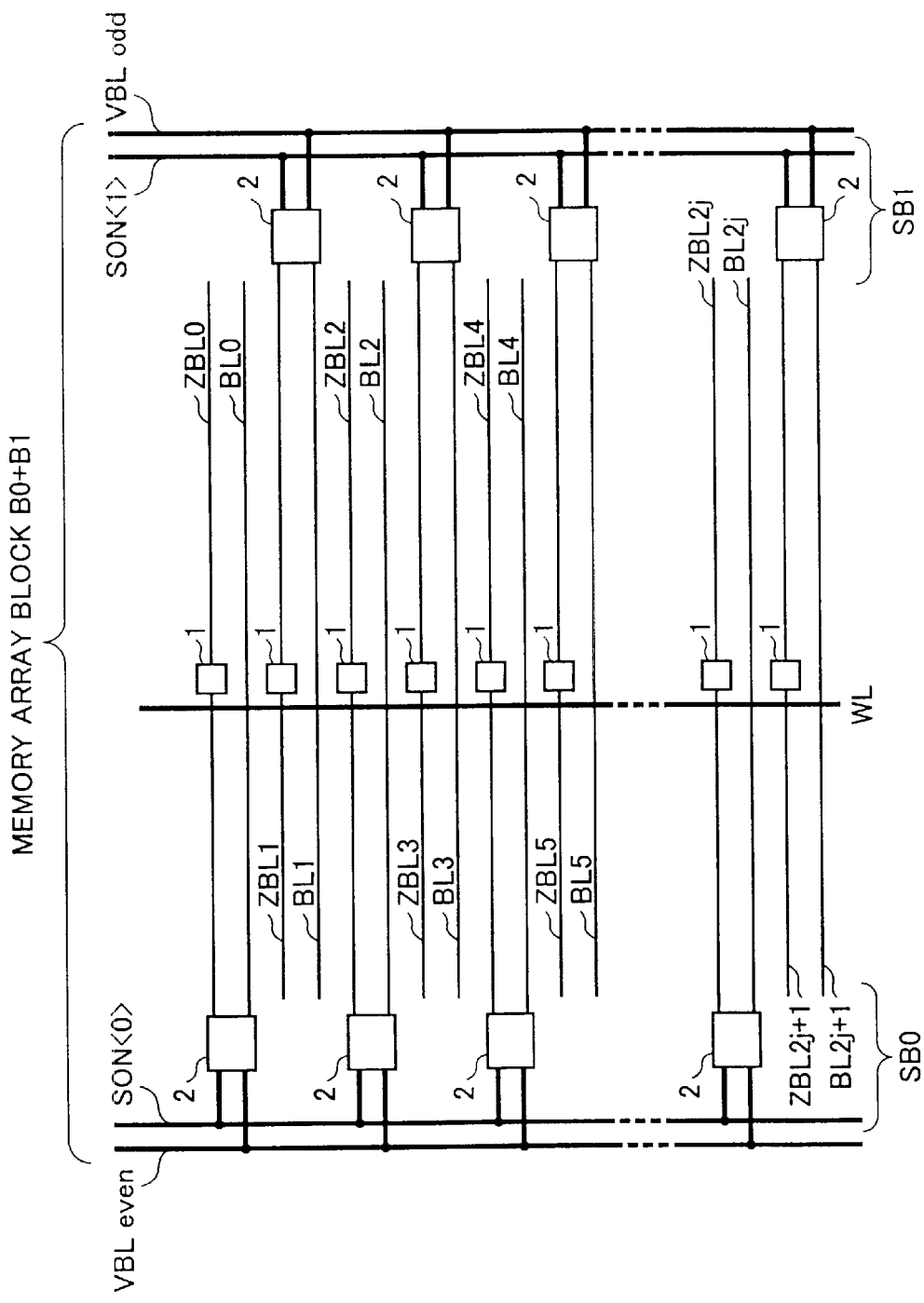
FIG. 9 illustrates a relation between reference potentials and sense amplifiers according to the third embodiment.

Specifically, referring to FIG. 9, sense amplifier units 2 included in a sense amplifier block SB0 are connected to line VBLeven and sense amplifier units 2 included in a sense amplifier block SB1 are connected to line VBLodd. Then, even-numbered bit line pairs and odd-numbered bit line pairs are supplied with respective reference voltages from different lines respectively and accordingly precharged.

The potentials on lines VBLeven and VBLodd change to a reference potential VBL or VBL2.

Referring to FIG. 8, when test mode signal TMO or TME is at "L" (normal mode), the potentials on lines VBLodd and VBLeven match with an output of VBL generating circuit 104.

When test mode signal TMO goes "H", the potential on line VBLodd is determined according to external output enable signal ext.ZOE. When test mode signal TME goes "H", the potential on line VBLeven is determined according to external output enable signal ext.ZOE.

Figure 10:
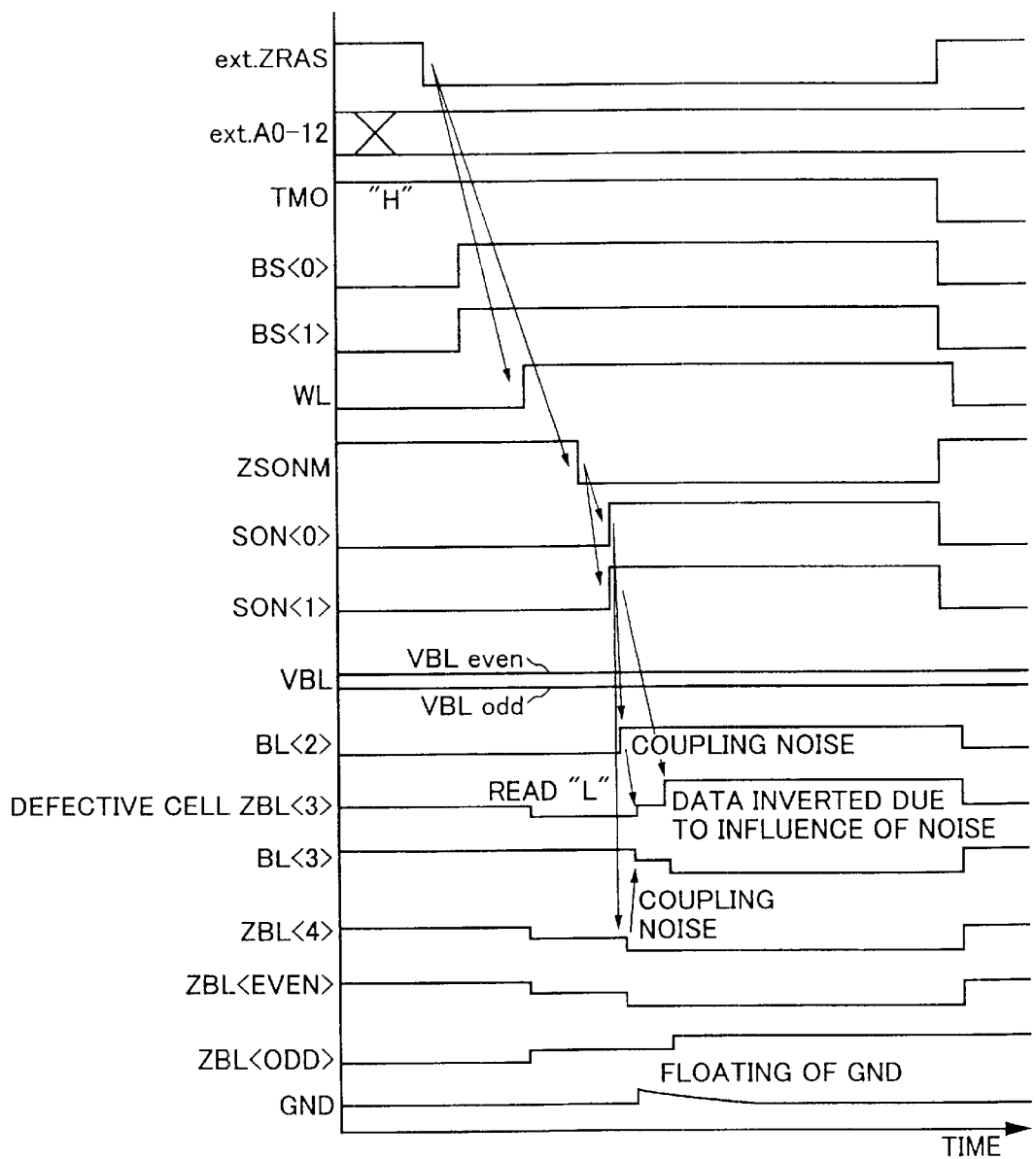
FIG. 10 is a timing chart illustrating an operation of the semiconductor memory device according to the third embodiment.

An operation of the semiconductor memory device according to the third embodiment is described in conjunction with FIG. 10. As the first and second embodiments, L data is written into all memory cells. External column address strobe signal ext.ZCAS and external write enable signal ext.ZWE are set at "L" before external row address strobe signal ext.ZRAS goes "L". It is assumed here that a combination of external address signals ext.A0 to ext.A12 sets test mode signal TMO at "H" and test mode signal TME at "L".

When external row address strobe signal ext.ZRAS goes "L", a selected word line WL goes "H" and internal signal ZSONM goes "L", which is similar to the operation of conventional memory devices.

According to external address signals ext.A0 to ext.A12, sense amplifier activation signals SON<0> and SON<1> rise to "H".

According to test mode signal TMO at "H", the potential on line VBLodd becomes reference potential VBL2. According to test mode signal TME at "L", the potential on line VBLeven becomes reference potential VBL.

For example, if reference potential VBL2 is lower than reference potential VBL, the potential on line VBLodd is accordingly lower than the potential on line VBLeven.

With regard to a sense amplifier SA, a higher reference potential allows the gate-source voltage Vgs of transistor T4 to be greater so that operation of the sense amplifier is accordingly faster.

Consequently, sense amplifiers SA of an even block operate prior to operation of sense amplifiers SA of an odd block. It is thus possible to immediately detect a defective cell without manipulation of data writing into memory cells.

Fourth Embodiment

Figure 11:
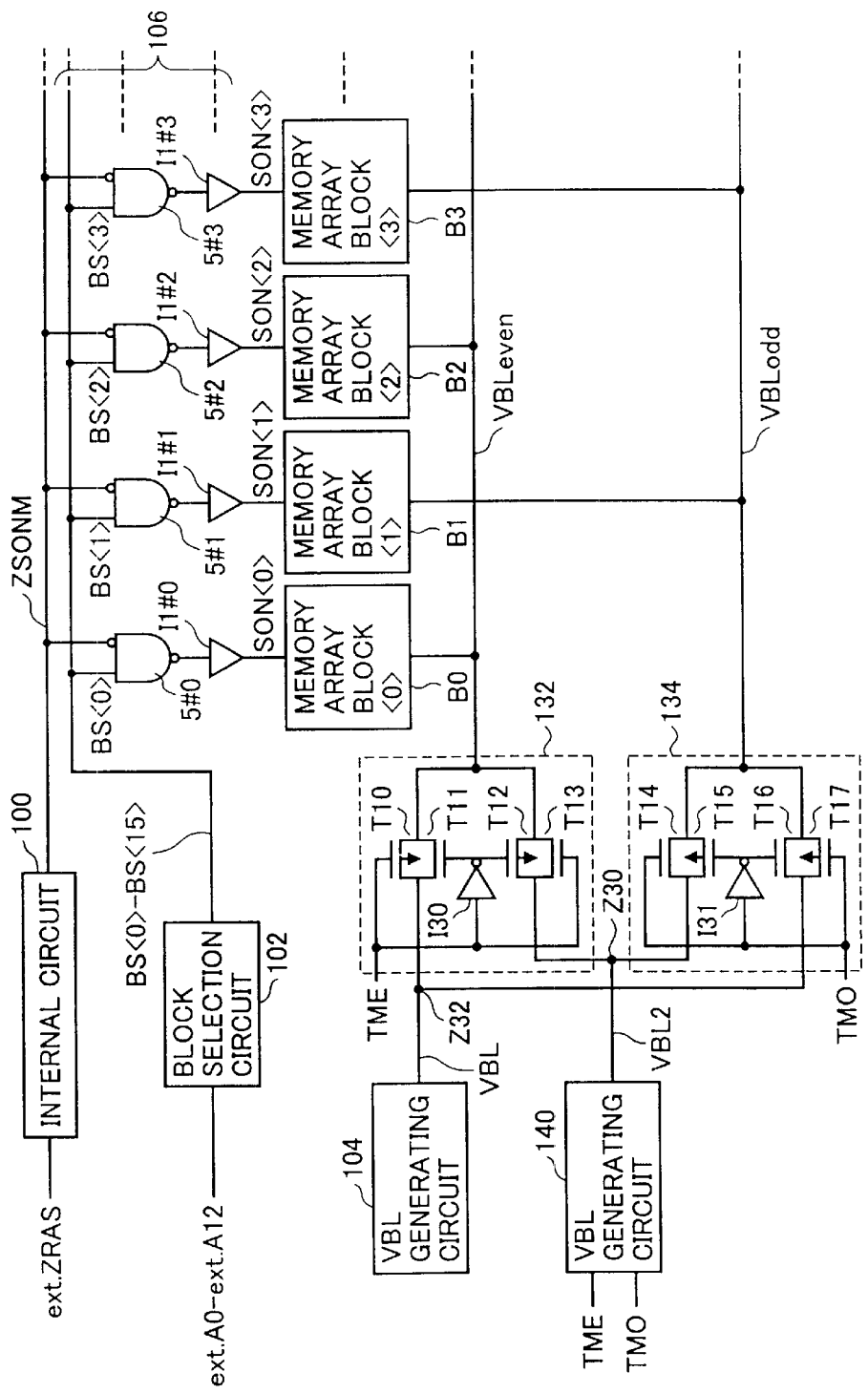
FIG. 11 illustrates a structure of a main portion of a semiconductor memory device according to a fourth embodiment.

A semiconductor memory device according to a fourth embodiment has its main portion structured as described below in conjunction with FIG. 11. The semiconductor memory device according to the fourth embodiment includes an internal circuit 100, a block selection circuit 102, VBL generating circuits 104 and 140, a VBL control circuit 132 related to even blocks, a VBL control circuit 134 related to odd blocks, a sense amplifier activation signal generating circuit 106, and memory array blocks B0, B1, . . . .

A logic circuit 5#i included in sense amplifier activation signal generating circuit 106 receives at its inputs an internal signal ZSONM and a block selection signal BS<i>. An inverter I1#i inverts an output of logic circuit 5#i to output a sense amplifier activation signal SON<i>.

VBL generating circuit 140 receives test mode signals TME and TMO to supply a reference potential VBL2 to a node Z30. VBL generating circuit 140 is activated when test mode signal TMO or TME goes "H" to generate reference potential VBL2 having its level different from that of a reference potential VBL.

VBL control circuit 132 supplies one of respective outputs of VBL generating circuits 140 and 104 to a line VBLeven. VBL control circuit 134 supplies one of respective outputs of VBL generating circuits 140 and 104 to a line VBLodd.

Reference potentials of two types are used to establish a difference between the reference potential supplied to an odd block and that supplied to an even block.

In this way, respective operation timings of a sense amplifier in the even block and that in the odd block can be controlled. Resultant effects are thus similar to those of the first embodiment.

Figure 12:
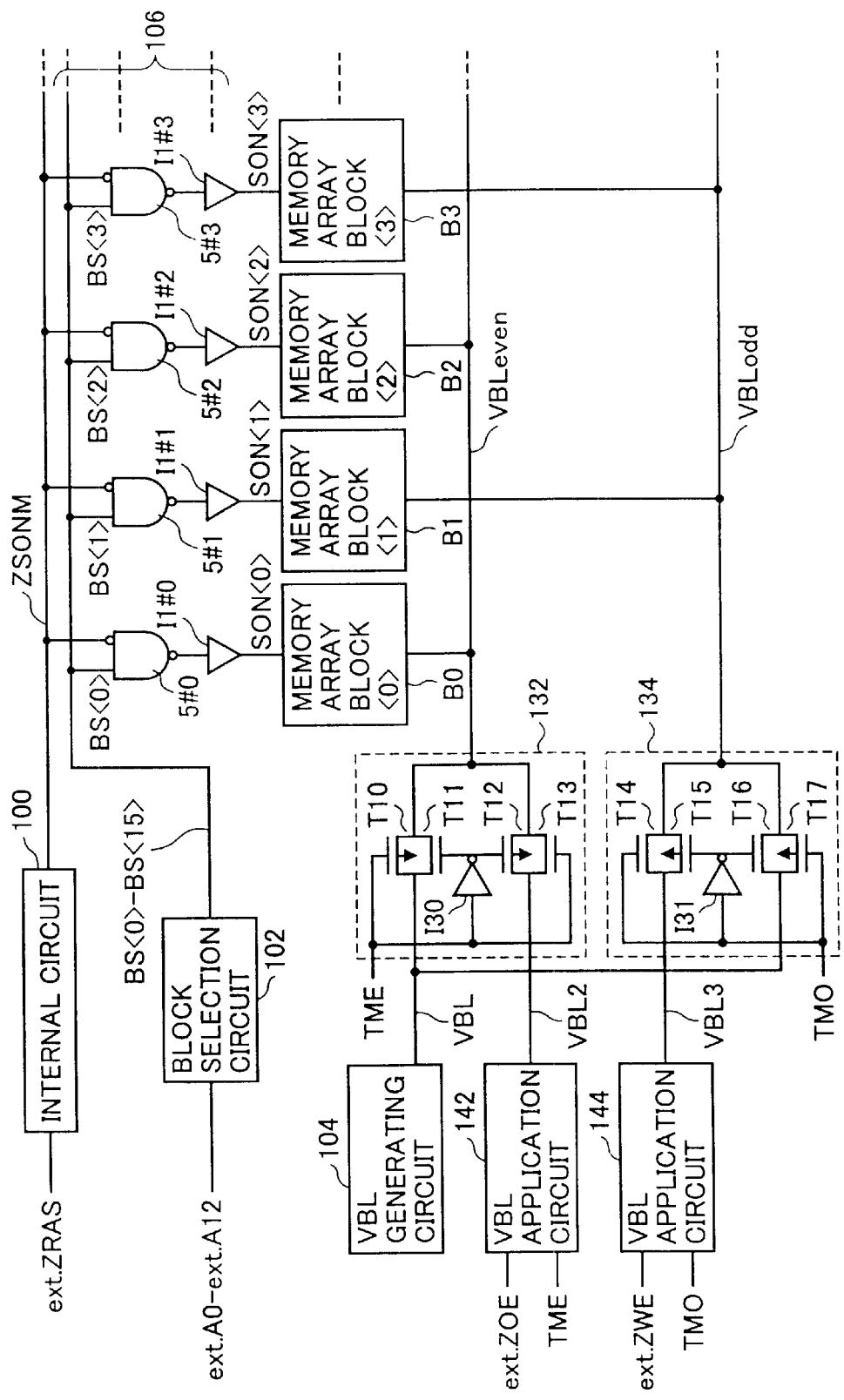
FIG. 12 illustrates another structure of the main portion of the semiconductor memory device according to the fourth embodiment.
Figure 13:
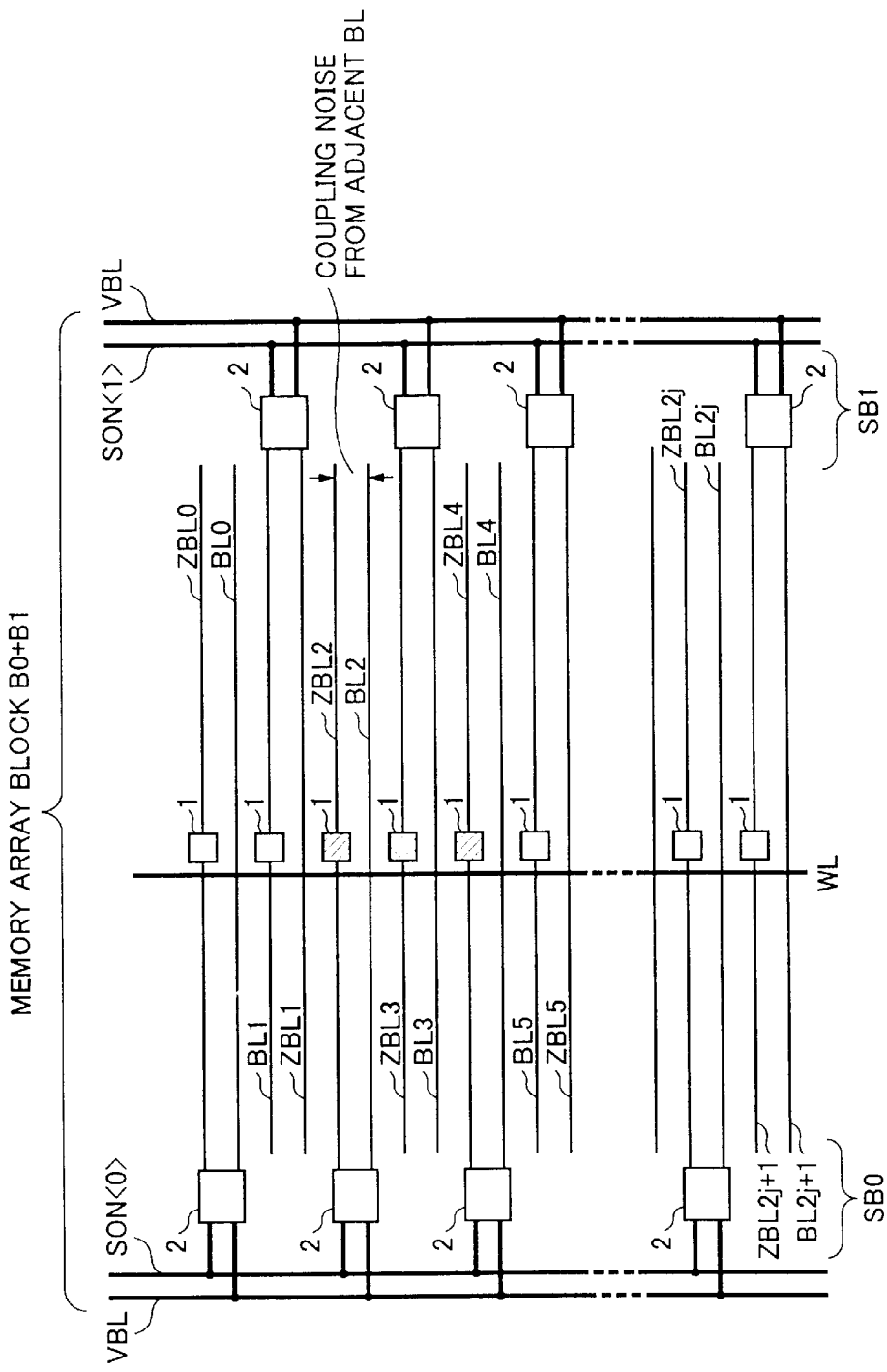
FIG. 13 illustrates a relation between bit line pairs and sense amplifier blocks in a conventional semiconductor memory device.
Figure 14:
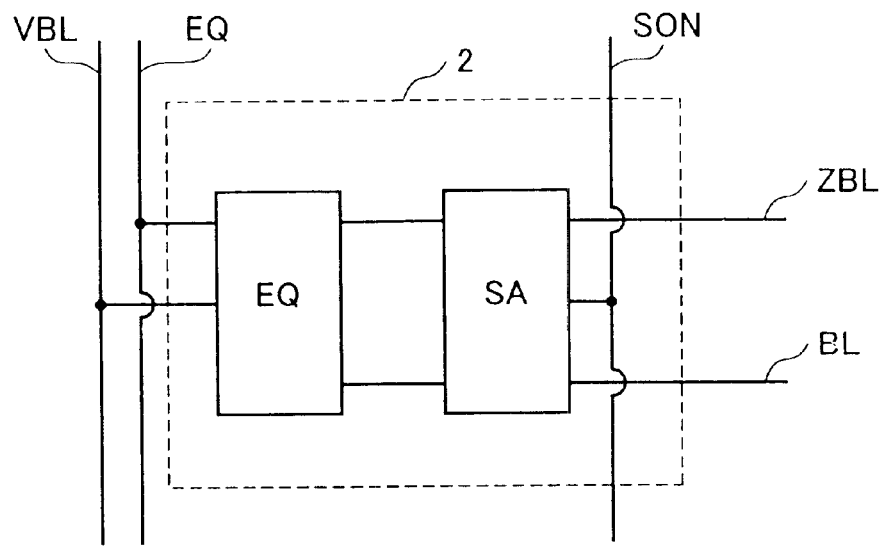
FIG. 14 schematically shows a structure of a sense amplifier unit of the conventional semiconductor memory device.
Figure 15:
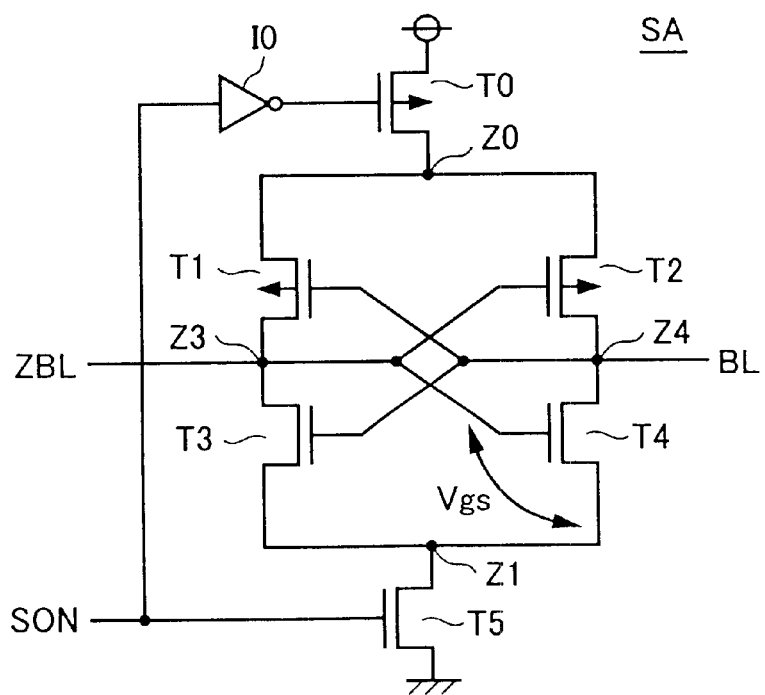
FIG. 15 shows a circuit structure of a sense amplifier SA.
Figure 16:
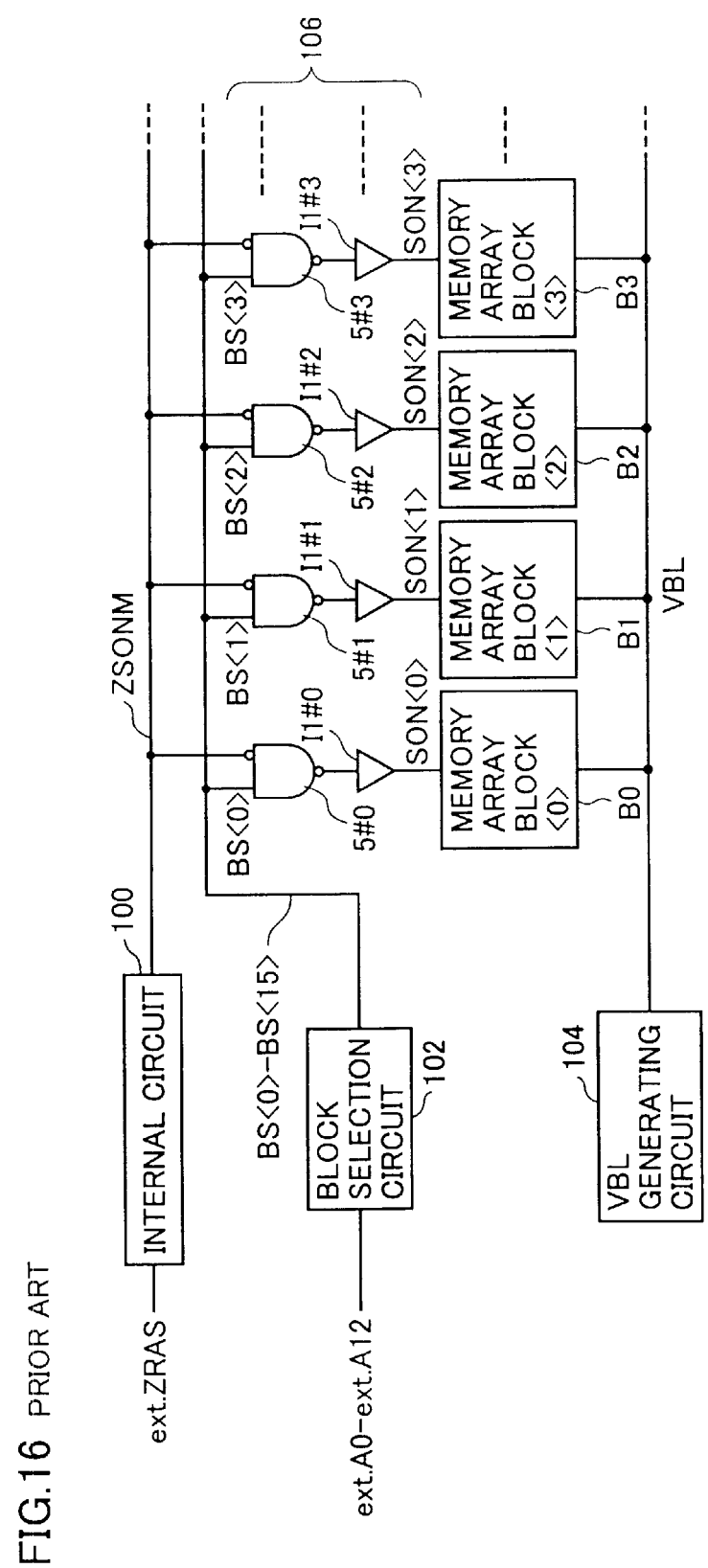
FIG. 16 illustrates a structure of a main portion of the conventional semiconductor memory device.
Figure 17:
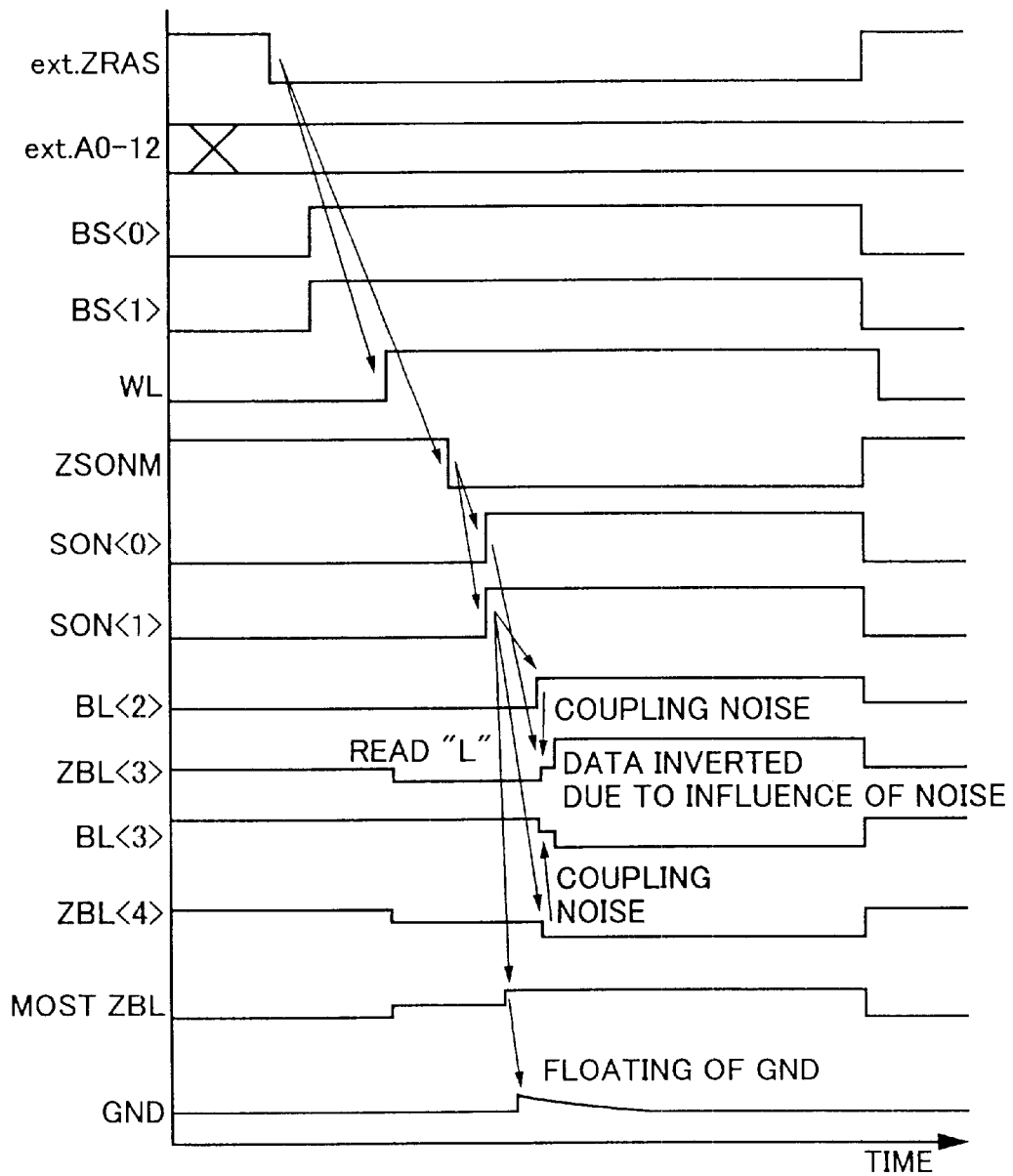
FIG. 17 is a timing chart illustrating an operation of the conventional semiconductor memory device.

The reference potentials are not limited to those of two types as employed in the example above. Specifically, a semiconductor memory device shown in FIG. 12 includes VBL application circuits 142 and 144.

VBL application circuit 142 receives external output enable signal ext.ZOE and test mode signal TME to output a reference potential VBL2. For example, when test mode signal TME rises to H level, output VBL2 has its potential level identical to that of external output enable signal ext.ZOE.

VBL application circuit 144 receives external write enable signal ext.ZWE and test mode signal TMO to output a reference potential VBL3. For example, when test mode signal TMO rises to H level, output VBL 3 has its potential level identical to that of external write enable signal ext.ZWE.

A VBL control circuit 132 sets the potential on line VBLeven at a reference potential VBL or reference potential VBL2 according to test mode signal TME.

A VBL control circuit 134 sets the potential on line VBLodd at reference potential VBL or reference potential VBL3 according to test mode signal TMO.

This structure also achieves independent control of respective reference potentials on a bit line pair related to an odd block and a bit line pair related to an even block.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a memory cell array including a plurality of memory cells arranged in a matrix of rows and columns, a plurality of word lines arranged corresponding to respective rows, and a plurality of bit line pairs arranged corresponding to respective columns;

first sense amplifiers for detecting potential differences of a first plurality of even-numbered bit line pairs among said plurality of bit line pairs;

second sense amplifiers for detecting potential differences of a second plurality of odd-numbered bit line pairs among said plurality of bit line pairs; and a sense amplifier control circuit for individually controlling respective operation timings of said first and second sense amplifiers.

2. The semiconductor memory device according to claim 1, wherein said sense amplifier control circuit includes:

a first block control circuit generating a first activation signal for controlling activation of said first sense amplifiers; and a second block control circuit generating a second activation signal for controlling activation of said second sense amplifiers.

3. The semiconductor memory device according to claim 2, wherein said first block control circuit includes:

a delay stage; and a circuit for outputting an activation signal as said first activation signal in a normal mode and outputting said activation signal delayed by said delay stage as said first activation signal in a test mode.

4. The semiconductor memory device according to claim 2, wherein said second block control circuit includes:

a delay stage; and a circuit for outputting an activation signal as said second activation signal in a normal mode and outputting said activation signal delayed by said delay stage as said second activation signal in a test mode.

5. The semiconductor memory device according to claim 2, wherein said first block control circuit generates said first activation signal in synchronization with an external input signal in a test mode.

6. The semiconductor memory device according to claim 2, wherein said second block control circuit generates said second activation signal in synchronization with an external input signal in a test mode.

7. The semiconductor memory device according to claim 2, wherein said first block control circuit generates said first activation signal in synchronization with a first external input signal in a test mode, and said second block control circuit generates said second activation signal in synchronization with a second external input signal in said test mode.

8. A semiconductor memory device comprising:

a memory cell array including a plurality of memory cells arranged in a matrix of rows and columns, a plurality of word lines arranged corresponding to respective rows, and a plurality of bit line pairs arranged corresponding to respective columns;

first sense amplifiers for detecting potential differences of a first plurality of even-numbered bit line pairs among said plurality of bit line pairs;

second sense amplifiers for detecting potential differences of a second plurality of odd-numbered bit line pairs among said plurality of bit line pairs;

a first line supplying voltage for precharging said first plurality of even-numbered bit line pairs;

a second line supplying voltage for precharging said second plurality of odd-numbered bit line pairs; and a control circuit for individually controlling respective voltages of said first and second lines.

9. The semiconductor memory device according to claim 8, wherein said control circuit includes:

a first block control circuit controlling the voltage of said first line; and a second block control circuit controlling the voltage of said second line.

10. The semiconductor memory device according to claim 9, wherein said first block control circuit includes a circuit for determining the voltage of said first line according to a signal received from an external input pin in a test mode.

11. The semiconductor memory device according to claim 9, wherein said second block control circuit includes a circuit for determining the voltage of said second line according to a signal received from an external input pin in a test mode.

12. The semiconductor memory device according to claim 9, wherein said first block control circuit includes a circuit for determining in a test mode the voltage of said first line based on a first test mode signal according to a signal received from a first external input pin, and said second block control circuit includes a circuit for determining in said test mode the voltage of said second line based on a second test mode signal according to a signal received from a second external input pin.

13. The semiconductor memory device according to claim 9, further comprising:

a first generating circuit generating a first reference voltage; and a second generating circuit generating a second reference voltage different from said first reference voltage, wherein said first block control circuit supplies said first reference voltage to said first line in a normal mode, and supplies said second reference voltage to said first line in a test mode.

14. The semiconductor memory device according to claim 9, further comprising:

a first generating circuit generating a first reference voltage; and a second generating circuit generating a second reference voltage different from said first reference voltage, wherein said second block control circuit supplies said first reference voltage to said second line in a normal mode, and supplies said second reference voltage to said second line in a test mode.

* * * * *